US006875289B2

(12) United States Patent
Christenson et al.

(10) Patent No.: US 6,875,289 B2
(45) Date of Patent: Apr. 5, 2005

(54) SEMICONDUCTOR WAFER CLEANING SYSTEMS AND METHODS

(75) Inventors: Kurt K. Christenson, Minnetonka, MN (US); Christina A. Rathman, Chaska, MN (US)

(73) Assignee: FSI International, Inc., Chaska, MN (US)

( * ) Notice: Subject to any disclaimer, the term of this patent is extended or adjusted under 35 U.S.C. 154(b) by 152 days.

(21) Appl. No.: 10/243,616

(22) Filed: Sep. 13, 2002

(65) Prior Publication Data

US 2004/0050405 A1 Mar. 18, 2004

(51) Int. Cl.[7] .................................................. B08B 3/00
(52) U.S. Cl. ........................... 134/36; 134/2; 134/31; 134/32; 134/34; 134/37; 34/498
(58) Field of Search ............................. 134/2, 31, 32, 134/34, 36, 37, 30; 34/498

(56) References Cited

U.S. PATENT DOCUMENTS

| 4,911,761 A | | 3/1990 | McConnell et al. |
| 4,984,597 A | | 1/1991 | McConnell et al. |
| 5,271,774 A | | 12/1993 | Leenaars et al. |
| 5,489,341 A | * | 2/1996 | Bergman et al. ............... 134/26 |
| 5,542,441 A | | 8/1996 | Mohindra et al. |
| 5,555,981 A | | 9/1996 | Gregerson |
| 5,651,379 A | | 7/1997 | Mohindra et al. |
| 5,749,467 A | | 5/1998 | Gregerson |
| 5,772,784 A | | 6/1998 | Mohindra et al. |
| 5,807,439 A | * | 9/1998 | Akatsu et al. ................. 134/32 |
| 5,931,721 A | | 8/1999 | Rose et al. |
| 5,967,156 A | | 10/1999 | Rose et al. |
| 6,012,472 A | | 1/2000 | Leenaars et al. |
| 6,041,938 A | | 3/2000 | Senn |
| 6,098,643 A | | 8/2000 | Miranda |
| 6,139,645 A | | 10/2000 | Leenaars et al. |
| 6,148,833 A | | 11/2000 | Tang et al. |
| 6,153,533 A | | 11/2000 | Senn |

(Continued)

FOREIGN PATENT DOCUMENTS

| BE | 0817246 | * | 1/1998 |
| EP | 1 049 139 | | 11/2000 |
| EP | 1 168 422 | | 1/2002 |

OTHER PUBLICATIONS

A.F.M. Leenaars, et al., "Marangoni Drying: A New Extremely Clean Drying Process," Langmuir, 6, 1990, 1701–1703.

J. Marra and J.A.M. Huethorst, "Physical Principles of Marangoni Drying," Langmuir, 7, 1991, 2748–2755.

J. Marra, "Ultraclean Marangoni Drying," Particles in Gases and Liquids 3: Detection, Characterization and Control, K.I. Mittal, ed., Plenum Press, New York, 1993.

*Primary Examiner*—M. Kornakov
(74) *Attorney, Agent, or Firm*—Kagan Binder, PLLC

(57) ABSTRACT

An immersion processing system is provided for cleaning wafers with an increased efficiency of chemical use. Such a system advantageously uses less cleaning enhancement substance that may be provided as gas, vapor or liquid directly to a meniscus or wafer/liquid/gas bath interface so as to effectively modify surface tensions at the meniscus with minimized chemical usage. Such a delivery system design may be applied for single wafer processing or for processing multiple wafers together within a single liquid bath vessel. For single wafer processing, in particular, cleaning enhancement substance can be delivered along one or both major sides of the wafer, preferably at the meniscus that is formed as the wafer and liquid are relatively moved, while a processing vessel usable for such single wafer processing may itself be designed with a minimized size to accommodate a single wafer. By reducing the vessel volume, chemical usage for any processing chemicals that are to be provided within a liquid bath may also be advantageously reduced.

14 Claims, 12 Drawing Sheets

U.S. PATENT DOCUMENTS

| | | |
|---|---|---|
| 6,170,495 B1 | 1/2001 | Leenaars et al. |
| 6,171,403 B1 | 1/2001 | Kamikawa et al. |
| 6,192,600 B1 | 2/2001 | Bergman |
| 6,203,406 B1 | 3/2001 | Rose et al. |
| 6,220,259 B1 | 4/2001 | Brown et al. |
| 6,256,555 B1 | 7/2001 | Bacchi et al. |
| 6,264,036 B1 | 7/2001 | Mimken et al. |
| 6,286,688 B1 | 9/2001 | Mimken et al. |
| 6,312,597 B1 | 11/2001 | Mohindra et al. |
| 6,328,814 B1 | 12/2001 | Fishkin et al. |
| 6,395,101 B1 * | 5/2002 | Scranton et al. .............. 134/32 |
| 6,401,732 B2 | 6/2002 | Bergman |
| 6,468,362 B1 * | 10/2002 | Chen et al. ................... 134/26 |
| 6,558,477 B1 * | 5/2003 | Scovell ........................ 134/30 |
| 2002/0121289 A1 * | 9/2002 | Brown et al. .................. 134/6 |

* cited by examiner

SEMICONDUCTOR WAFER CLEANING SYSTEMS AND METHODS

FIELD OF THE INVENTION

The present invention relates to the wet processing and cleaning of semiconductor wafers within a liquid bath and the subsequent separation of wafers from the liquid bath while cleaning wafer surfaces. In particular, the present invention relates to separation of one or more wafers from a liquid bath after wet processing while providing a cleaning enhancement substance to an object/liquid/gas interface for enhanced surface cleaning.

BACKGROUND OF THE PRESENT INVENTION

Wet processing of many types of objects often includes a step of separating the object from the liquid as either a finished product or for further processing. Moreover, it is often desirable to rinse and/or clean the object after wet processing to remove any contaminants or left over and unwanted processing liquids and to provide a clean processed object. Also, in many cases, depending on any further treatment or handling, the object may be further dried to remove any processing or rinsing liquids that may still be present on a surface of the object.

In the case of processing microelectronic devices, such as including semiconductor wafers at any of various stages of processing, flat panel displays, microelectrical-mechanical-systems (MEMS), advanced electrical interconnect systems, optical components and devices and components of mass data storage devices (disk drives) and the like, cleanliness is critical in virtually all processing aspects. Representative steps in wet processing of wafers include wafer etching and rinsing. For processing such microelectronic devices, it is important to use clean processing liquids so as not to introduce contaminants into the processing environment, and likewise as important to separate the wafer(s) from the liquid bath in a way to substantially prevent contaminant deposition onto a wafer surface, including contaminants that may be suspended within the liquid bath (as potentially present from the processing liquid, the wafer surface, or as a result of the processing step).

In this regard, techniques and apparatuses have been developed for rinsing and separating wafers from immersion (or liquid bath) type processes, and, by such process or by a subsequent drying process, to leave wafer surfaces substantially clean. A popular rinsing technique is known as cascade rinsing. Such cascade rinsing utilizes a cascade rinser having inner and outer chambers that are separated from one another by a partition or weir. Rinse water flows from a water source into the inner chamber. The inner chamber fills with rinsing liquid until it overflows so that rinsing liquid cascades over the partition or weir into the outer chamber. Typically, DI water is used as the rinsing liquid, which DI water is preferably rendered extremely clean, such as by filtering as disclosed in U.S. Pat. Nos. 5,542,441, 5,651,379 and 6,312,597 to Mohindra et al.

Separation, itself, can be accomplished in many different ways utilizing many different kinds and complexities of mechanisms. However, the basic step of separation is relatively quite simply characterized as the gradual replacement of a liquid environment about an object or portion thereof with a gas environment. For an inline type immersion process, separation is typically done by replacing one fluid that is supplied inline with a subsequent fluid (e.g. changing from rinse liquid to clean gas). See, for example, U.S. Pat. Nos. 4,984,597 and 4,911,761 to McConnell et al. For a liquid bath type immersion process (i.e. where one or more wafers are supported or suspended within liquid contained by a vessel), such separation is normally accomplished by either lifting the wafers from the bath or by draining the liquid from the vessel. For lifting, many different wafer handlers or elevators are known for lifting wafers themselves or for lifting a wafer cassette or the like that may support and contain many wafers as a set. Where the liquid bath is drained, the wafers may be supported by structure within the vessel or by a removable cassette so that the wafers can be stationary during liquid removal.

Separation itself, however, does not necessarily result in dry wafers. That is, after a rinsing step, a drying step may need to be conducted depending on parameters of the separation (e.g. speed of separation, orientation of the wafers, and the like) as well as characteristics of the wafers themselves (e.g. hydrophilic or hydrophobic nature of the wafer surface). Any liquid droplets or films that remain on a wafer surface after separation, such as may result at or near contact points with support structure or as minute droplets or films that hold to the wafer surface, are desirably removed from the wafer surface. If such droplets or films are left to evaporate from the wafer surface, any contaminants within the droplets or films will be deposited on the wafer surface, which contaminants may render a portion of the wafer unsuitable for further processing or use. Known drying techniques include the use of heated liquids and/or heated gases, such as heated nitrogen gas, during and after the rinsing step for removing unwanted droplets and films from the wafer surfaces. However, minute liquid droplets or films are sometimes very difficult to remove due to their attraction to the wafer surfaces.

A manner to enhance rinsing and separation of the wafers from the liquid bath so that liquid droplets and films do not substantially remain on the wafer surfaces after separation has been developed based on the introduction of a cleaning enhancement substance that tends to accelerate liquid from the wafer surface during separation by reducing surface tension of the liquid near the wafer surface. By cleaning enhancement, it is meant that the separation step is enhanced or improved by the presence of the substance, i.e. a cleaner separation results. Specifically, it is known to use isopropyl alcohol (IPA) that is supplied within a gas environment that replaces the liquid environment. Whether the process is an in-line process, a liquid drain process or a wafer lift process, the liquid environment surrounding the wafers is replaced by a gas environment, which gas environment can comprise the IPA with other gas and/or a carrier gas. As an example of an in-line process, U.S. Pat. No. 4,911,761 to McConnell et al. describes the use of superheated saturated drying vapor as a drying fluid that is used to replace a liquid environment. Processes and techniques for replacing the liquid environment surrounding wafers with a gas environment that includes a cleaning enhancement substance such as IPA in dilute quantity for effectively cleaning wafer surfaces during the separation stage are described in U.S. Pat. No. 5,772,784 to Mohindra et al. The specific processes described within Mohindra et al. include draining rinse liquid from a vessel for separating the liquid from the wafer surfaces. Methods of separating wafers from a liquid rinse environment within a vessel by lifting the wafers while supplying IPA above the wafers are described in U.S. Pat. Nos. 6,012,472, 6,139,645 and 6,170,495 to Lenaars et al.

Methods utilizing dilute quantities of IPA are a significant improvement in that wafer may be successfully rinsed, cleaned and dried with lower chemical usage, which is more environmentally friendly as well as less costly. The same is desirable with any and all processing chemicals that may be utilized within an immersion vessel for processing wafers. As the above-noted prior art describes, batch processing of a set of wafers together is desired for wafer processing throughput as well as to use such processing chemicals most effectively. However, such chemical use effectiveness is based upon the processing of a full set of wafers at all times. Processing of less than a full set becomes less and less effective because the vessels themselves contain the same volumes that must be filled by processing liquids as well as processing gases, thereby increasing the volume of process fluids and gases used per wafer processed.

SUMMARY OF THE PRESENT INVENTION

The present invention overcomes the deficiencies and shortcomings of the prior art by providing an immersion processing system for cleaning wafers that increases the efficiency of chemical use. Such a system advantageously uses less cleaning enhancement substance that may be provided as gas, vapor or liquid directly to a meniscus or wafer/liquid/gas bath interface so as to effectively modify surface tensions at the meniscus with minimized chemical usage.

Also, the present invention takes advantage of such a delivery system design as it may be applied for single wafer processing or for processing multiple wafers together within a single liquid bath vessel. For single wafer processing, in particular, cleaning enhancement substance can be delivered along one or both major sides of the wafer, preferably at the meniscus that is formed as the wafer and liquid are relatively moved, while a processing vessel usable for such single wafer processing may itself be designed with a minimized size to accommodate a single wafer. By reducing the vessel volume, chemical usage for any processing chemicals that are to be provided within a liquid bath may also be advantageously reduced.

Applying cleaning enhancement substance directly to the meniscus also has many benefits. Direct application promotes a higher concentration of cleaning enhancement substance in the meniscus region compared to other areas of the liquid's surface. The large concentration gradient creates a large surface tension gradient that allows control of the cleaning enhancement substance concentration profile along the meniscus and reduces chemical usage as it is not necessary to fill or flush a large volume above the liquid with the cleaning enhancement substance.

Direct application also maintains the efficiency of chemical usage in partially-loaded batch systems. As each meniscus has a dedicated stream of cleaning enhancement substance, it is possible to deactivate the flow of cleaning enhancement substance to applicators where no wafer is present. Chemical usage scales with the number of wafers processed, providing efficient usage even when processing a single wafer.

The overflowing bath of liquid allows the cleaning enhancement substance-laden liquid away from the meniscus to be removed in a non-turbulent manner and replaced by fresh liquid. This maintains the surface tension of the liquid away from the meniscus and aids in rapid separation. The non-turbulent nature of the liquid flow allows a controlled, consistent motion of the meniscus across the wafer.

Thus, in accordance with one aspect of the present invention, a method of rinsing a microelectronic device includes the steps of immersing at least a portion of a surface of the microelectronic device within an immersion vessel containing a liquid bath, separating the microelectronic device from the liquid bath to thereby form a meniscus at an interface between the surface of the microelectronic device and the liquid bath, and delivering a cleaning enhancement substance to the meniscus that is formed while the microelectronic device is separated from the liquid bath, the delivery of cleaning enhancement substance being conducted by supplying controlled fluid flow along the direction of extension of the meniscus along the surface of the microelectronic device so that a gradient in the surface tension of the liquid at the meniscus is created.

Preferably, the delivery of cleaning enhancement substance is conducted as a series of gas streams arranged along the direction of extension of the meniscus along the surface of the microelectronic device so that a gradient in the surface tension of the liquid at the meniscus is created. More preferably, the cleaning enhancement substance comprises IPA that is delivered with a carrier gas. The IPA may be gas or vapor itself within the carrier gas or may comprise atomized liquid droplets carried by the carrier gas.

In accordance another aspect of the present invention, a single device processing vessel is provided that is preferably sized to accommodate a single microelectronic device, but with a reduced vessel volume for reducing processing liquid usage, and with the ability to rinse and clean the single microelectronic device effectively. In particular, such a method of rinsing a microelectronic device includes immersing at least a portion of first and second major surfaces of the microelectronic device within an immersion vessel containing a liquid bath, separating the microelectronic device from the liquid bath and forming a meniscus at an interface between each of the first and second major surfaces of the microelectronic device and the liquid bath, and delivering a first stream of cleaning enhancement substance to the meniscus between the first major surface and the liquid bath that is formed while the microelectronic device is separated from the liquid bath, and independently delivering a second stream of cleaning enhancement substance to the meniscus between the second major surface and the liquid bath that is formed while the microelectronic device is separated from the liquid bath. As such, both major surfaces of a microelectronic device may be rinsed and effectively cleaned from a single device vessel that advantageously utilizes less processing liquids as well as lessening the usage of a cleaning enhancement substance, such as IPA. An apparatus in accordance with this aspect is characterized by a single microelectronic device processing vessel and a spaced pair of delivery nozzles having spaced delivery orifices arranged generally parallel from one nozzle to the other, the delivery nozzles further being in operative connection with a source of cleaning enhancement substance while the processing vessel is itself to be operatively connected with a processing liquid source and a liquid drain.

In accordance with yet another aspect of the present invention, multiple microelectronic devices may be processed together by a delivery system that utilizes independent microelectronic device rinsing and cleaning by have a separate delivery nozzle for each microelectronic device. Such an apparatus is characterized by having plural space delivery nozzles having spaced delivery orifices that run generally parallel from one nozzle to another, but which nozzles are arranged to accommodate separately supported microelectronic devices. Such an arrangement of nozzles can be characterized in that at least a plurality of the nozzles have delivery orifices that are oriented similarly. That is, plural nozzles are provided to treat a same microelectronic device side of plural microelectronic devices that are supported in similar orientation.

A method of rinsing a plurality of microelectronic devices in accordance with this aspect includes the steps of immersing at least a portion of first and second major surfaces of a plurality of the microelectronic devices within an immersion vessel containing a liquid bath, separating the microelectronic devices from the liquid bath and forming a meniscus at an interface between a major surfaces of each of the microelectronic devices and the liquid bath, and, for each of the plurality of microelectronic devices, delivering a first stream of cleaning enhancement substance to the meniscus between a major surface and the liquid bath that is formed while the microelectronic device is separated from the liquid bath. Preferably, such a method further includes treating both major side surfaces of each microelectronic device by independently delivering a second stream of carrier gas including cleaning enhancement substance to the meniscus between the second major surface and the liquid bath that is formed while the microelectronic device is separated from the liquid bath.

In accordance with yet another aspect of the present invention, multiple microelectronic devices may be processed together by an arrangement of a plurality of vessels, each vessel being preferably designed for processing a single microelectronic device for the advantageous reasons set forth above. Each vessel thus includes a delivery system that provides for independent microelectronic device rinsing and cleaning by having a separate delivery nozzle for each vessel and thus each microelectronic device.

A method in accordance with this aspect includes the steps of providing a plurality of immersion vessels containing a liquid bath, immersing at least a portion of a surface of a microelectronic device within the liquid bath of one of the plurality of the immersion vessels while immersing at least a portion of a surface of another of the plurality of microelectronic devices within a different immersion vessel, separating the microelectronic devices from their respective liquid baths and forming meniscus at interfaces between a surface of each microelectronic device and its respective liquid bath, and, for each of the plurality of microelectronic devices, delivering cleaning enhancement substance to the meniscus between the surface and the liquid bath that is formed while the microelectronic device is separated from the liquid bath. A significant further advantage of such an arrangement and method of processing is that any number of such independent vessels can be arranged together in an array, for example, of any size. That is, such an arrangement and method are totally scalable depending on application needs. Furthermore, such an arrangement permits a usage of less than all of the vessels so that one or any number up to the arrangement number vessels can be used for any particular need, thus reducing the processing liquid and cleaning enhancement substance usage also by only using the vessels that are needed for a particular need. Thus, even a single wafer can be processed without the need to run a whole batch process.

DETAILED DESCRIPTION OF THE PREFERRED EMBODIMENTS

Figure 1:
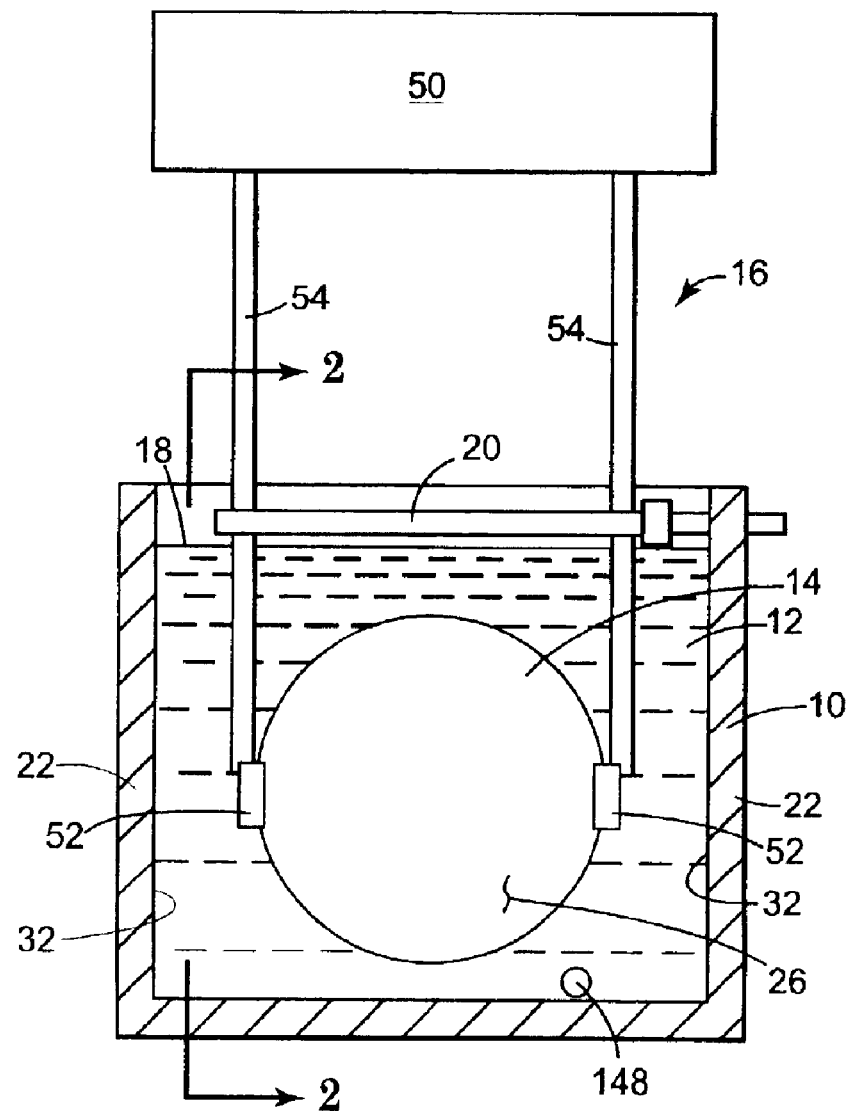
FIG. 1 is a cross-sectional side view of a single wafer liquid bath vessel illustrating a wafer immersed within the liquid bath as supported therein by a lift mechanism.
Figure 2:
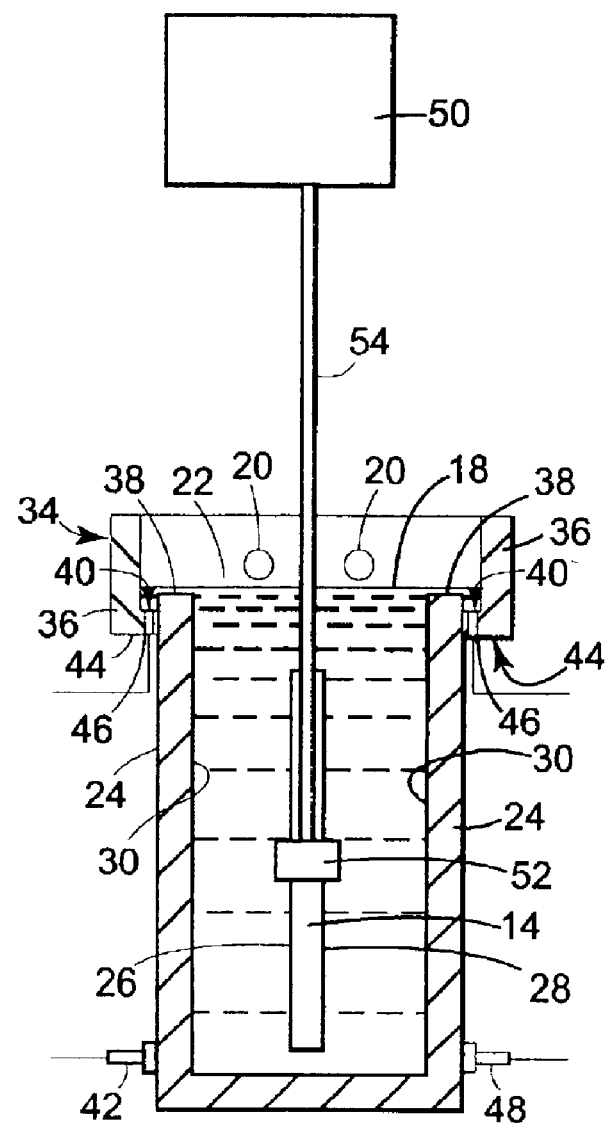
FIG. 2 is a cross-sectional side view taken along line 2—2 of FIG. 1 and also showing a wafer immersed within the liquid bath and supported therein by a lift mechanism.
Figure 3:
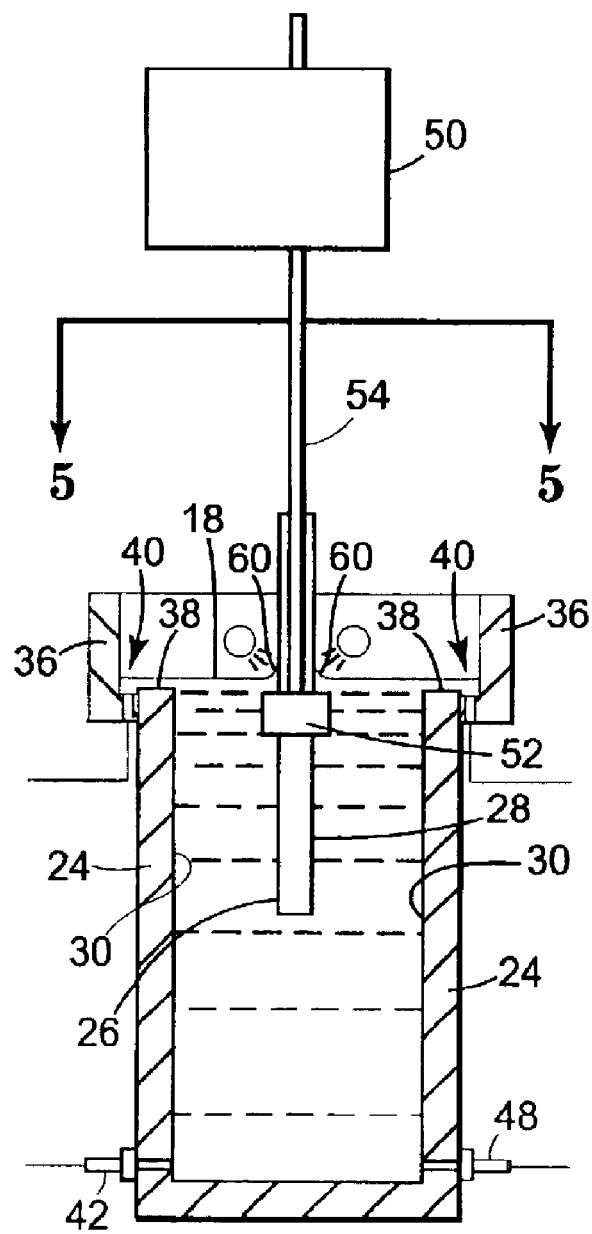
FIG. 3 is a cross-sectional side view similar to FIG. 2 but showing the wafer partially removed from the liquid bath by the lift mechanism and illustrating the formation of a meniscus at the interface of each major surface of the wafer and the liquid top surface as well as the delivery of cleaning enhancement substance along each meniscus.

With reference to the accompanying figures, wherein like components are labeled with like numerals throughout, and initially to FIGS. 1–3, a single wafer size liquid bath or immersion vessel 10 is illustrated within which a quantity of processing liquid 12 is contained. A wafer 14 is shown immersed entirely within the processing liquid 12 and supported therein by a lift mechanism 16. Above a liquid surface 18, a pair of nozzles 20 are illustrated for delivering cleaning enhancement substance as set out in greater detail below.

Figure 5:
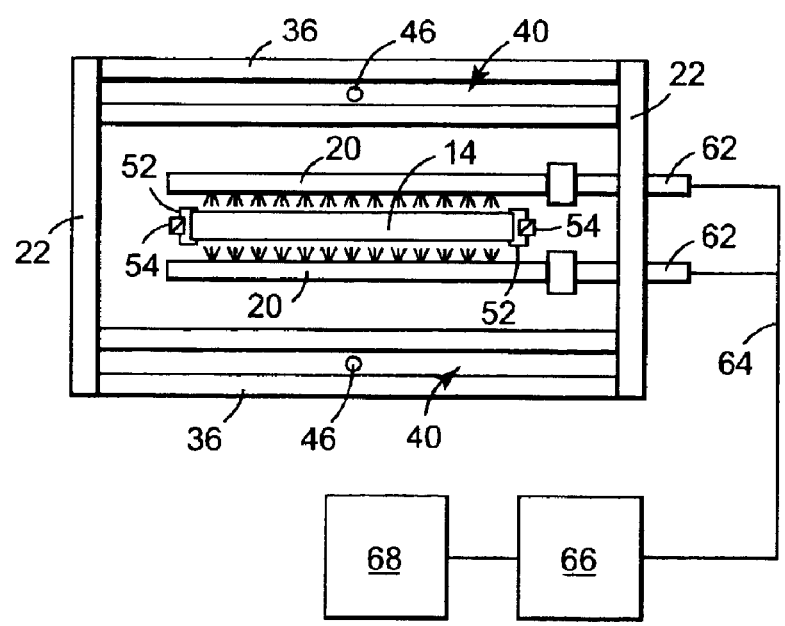
FIG. 5 is a top view taken along line 5—5 of FIG. 3 illustrating, in particular, the delivery of cleaning enhancement substance preferably substantially along the wafer major surfaces at the meniscus formed on both wafer sides.

Immersion vessel 10, as illustrated, can be generally rectangularly shaped from above (see FIG. 5) for accommodating a single wafer as a microelectronic device that may be processed in accordance with the present invention. The microelectronic devices that are processable in accordance with the present invention include semiconductor wafers of all types including those at any stage of processing, flat-panel displays, MEMS devices, electrical interconnect devices and systems, optical components, components of mass storage devices and the like. As discussed above in the Background section of the subject application, such microelectronic devices normally require processing under extremely clean conditions, and as such, find particular benefit from processing, rinsing and cleaning techniques of the present invention.

The illustrated immersion vessel 10 of FIGS. 1–3 is designed, in accordance with one aspect of the present invention, to accommodate single wafer processing illustrated by a single wafer 14. Specifically, the illustrated immersion vessel 10 comprises a pair of spaced end walls 22 and a pair of spaced sidewalls 24. The end and sidewalls 22 and 24, respectively, and the materials that make up all components within vessel 10 may comprise any material suitable for a particular processing liquid 12 application, and they may be formed of any number of separate components or as components integral with one another. The end walls 22 are preferably dimensioned to accommodate the height of processing liquid 12 that is needed in order to cover a wafer 14 suspended or otherwise supported within immersion vessel 10 and to accommodate a wafer thickness and whatever fluid flow requirements are needed to permit sufficient processing liquid 12 presence or flow between the oppositely facing major surfaces 26 and 28 of wafer 14 and inside surfaces 30 of sidewalls 24. Likewise, sidewalls 24 are preferably dimensioned to accommodate the height of processing liquid 12 that is needed in order to cover a wafer 14 suspended or otherwise supported within immersion vessel 10 and to accommodate a wafer diameter and whatever fluid flow requirements are needed to permit sufficient processing liquid 12 presence or flow between its diametrically opposed edges and inside surfaces 32 of end walls 22. Such edge flow requirements may be substantially minimal since wafer edge processing is not normally conducted.

For other shaped microelectronic devices, it may be desirable to provide a completely differently shaped immersion vessel 10 that may comprise any number of components, the purpose of which is to contain a quantity of processing liquid 12 for treating, rinsing and/or cleaning any portion of or complete microelectronic device.

In accordance with a rinsing operation from which a wafer 14 is to be cleanly separated, such as illustrated in FIGS. 1–3, it is preferable to run rinsing liquid through the immersion vessel 10 past the major surfaces 26 and 28 of wafer 14. To controllably do this, a cascade rinser may be provided comprising the immersion vessel 10 as an inner vessel and an outer vessel 34. The outer vessel 34 may completely surround immersion vessel 10 or it may be provided only along one or more portions of the immersion vessel 10. Such an outer vessel 34 is characterized as creating a volume where fluid flow over at least a portion of an edge of any wall of the immersion vessel 10 can flow and by which the fluid is directed away from the immersion vessel 10. In accordance with the illustrated embodiment, the outer vessel 34 comprises outer sidewalls 36 that extend higher than the top edges 38 of sidewalls 24 and which are connected to outer surfaces of the sidewalls 24 operatively at or below the top edges 38 by any conventional or developed connection or integral making technique. This design permits fluid flow over the top edges 38 and into channels 40 that are preferably created between top portions of sidewalls 24 and the outer sidewalls 36. The embodiment illustrated in FIGS. 1–3 does not include end wall outer walls, although such may be provided if desired.

In the illustrated embodiment of FIGS. 1–3, the top edges 38 create a weir structure over which processing liquid can flow. Such top edge surfaces may be flat, as shown, or may be tapered or angled down into channels 40. One or more notches or other openings may also be provided to assist in fluid flow dynamics and/or distribution along the weir structure.

For supplying processing fluid 12, such as rinsing fluid as part of a cascade rinser, a fluid inlet 42 permits fluid communication from a processing liquid source (not shown) into the interior of the immersion vessel 10. As processing fluid 12 is supplied via the fluid inlet 42, and after the immersion vessel 10 is filled with processing liquid 12 up to its sidewall top edges 38, continued processing fluid 12 flow will cause the processing fluid 12 to spill or cascade over the top edges 38 into the channels 40 provided by outer sidewalls 34. Spacing portions 44 of the outer sidewalls 36 not only help define the width of channels 40, but also provide space to accommodate outer vessel fluid drains 46. With separate channels 40 formed as illustrated, each channel 40 will preferably include an outer vessel fluid drain 46, which drains themselves can be provided in any conventional or developed way. The immersion vessel 10 itself is preferably drainable for removing processing liquid 12 at any desired time by way of an immersion vessel drain 48 that may also be further operatively connected with the drain reservoir. Each of the inlet and drains discussed above may be further controlled by any conventional or developed valve mechanisms and/or control systems for controlling fluid flow into and out of the immersion vessel 10 and outer vessel 34 (or plural portions thereof). If no outer vessel 34 is provided in any way, processing liquid 12 may simply spill over any edge of the immersion vessel 10.

In the case of an immersion vessel 10 as part of a system where wafers are lifted from and lowered into the immersion vessel 10 (as may be part of any additional system that may include other immersion vessels or other processing stations), a lift mechanism 16 may be utilized for separating the wafer 14 from the environment comprising the processing liquid 12, and preferably moving the wafer 14 into an environment comprising gas (which gas environment may also comprise atomized liquids or the like). Such a lift mechanism may comprise any known or developed system suitable for gripping the wafer 14 and moving it within and out from the interior volume of the immersion vessel 10, and preferably for moving the wafer 14 between a position above immersion vessel 10 and a position within the vessel 10. Multiple wafer handling devices or systems are also contemplated to distinctly handle one or more wafer moving aspects. Moreover, the wafer 14, or other microelectronic device (that may be differently shaped) may be supported itself within a carrier or cassette (not shown) designed accordingly. Also, it is contemplated that a support structure and/or cassette (not shown) may be provided within the volume of the immersion vessel 10 for supporting wafer 14 as it may be positioned, for example, by a lift mechanism 16.

A lift mechanism 16 is schematically illustrated in FIGS. 1–3 as comprising a drive mechanism 50 operatively connected with edge gripping pads 52 by way of suspension elements 54. The gripping pads 52 may be stationary with respect to one another or may be movable relative to one another for gripping wafer 14. As stationary gripping pads 52, they would be supported by suspension elements 54 to be inserted and positioned under the horizontal diameter of wafer 14 so that wafer 14 can be lowered and lifted. As movable gripping pads 52, one or both of the gripping pads 52 may be moved by articulation of one or both suspension elements 54 relative to a support structure, such as the schematically illustrated drive mechanism 50. Moreover, a drive mechanism 50 may not only provide the motive force for raising and lowering wafer 14 by way of suspension elements 54 and gripping pads 52, for example, it may also provide a motive force for moving one or both gripping pads 52 toward or from one another by way of suspension elements 54. Any known or developed wafer gripping and lifting and lowering mechanism is contemplated to be used in accordance with the present invention. It is preferable, however, that edge gripping be utilized to minimize overlaying the first and second major surfaces 26 and 28 of wafer 14 and to facilitate better processing, rinsing and cleaning of such wafer surfaces. Suitable edge gripping type lift mechanisms are also described, for example, in co-pending U.S. Provisional Patent Application Ser. No. 60/338,044, filed Nov. 13, 2001, which is commonly owned by the assignee of the subject application and the disclosure of which is fully incorporated herein by reference.

Alternatively, for changing the environment comprising the processing liquid 12 to an environment comprising gas (i.e. for separating the wafer from its processing liquid bath), the processing liquid 12 may be drained from the immersion vessel 10, such as via drain 48. Wafer 14 may be supported from above, as schematically illustrated, or may be supported by a cassette or other support device (not shown) provided within the immersion vessel 10. During processing liquid 12 drainage, the cascading effect (if provided for) would cease, unlike a lifting type separation where the cascading effect (if provided for) could continue. It is also contemplated that wafer separation could be conducted by any combination of lifting and draining processing liquid 12.

In accordance with processes of the present invention, the processing liquid 12 may comprise any processing liquid to which exposure to at least a portion of a wafer surface is desired and which processing liquid is to be delivered to such wafer surface as an immersion or liquid bath type process. That is, for semiconductor wafer processing as an example, the processing liquid 12 may comprise an active processing fluid such as an etchant, which could be an HF solution, a buffered HF solution, an HCl solution, or the like, and that may be the controllably caused to flow over surfaces of wafer 14.

For rinsing a wafer 14, as another example, such as may be conducted after any processing step like an HF etching step, rinsing liquid may be supplied to the immersion vessel 10 after a first processing liquid is drained, or, in the case with a cascade processing vessel, the rinsing liquid may be supplied subsequently in order to controllably displace the processing liquid flowing past the wafer surfaces. For rinsing, DI water is preferred as the processing liquid 12 for cleaning or rinsing wafer 14 surfaces and removing any left over processing liquids from any previous processing step. More preferably, ultra-purified DI water is supplied for such a rinsing process, such as may be obtained by a filtering system described in commonly owed U.S. Pat. Nos. 5,542,441, 5,651,379 and 6,312,597 to Mohindra et al., the entire disclosures of which are incorporated herein by reference.

After a wafer 14 is processed and/or rinsed, it is desirable to remove or separate the wafer 14 from its liquid environment and progressively introduce the wafer 14 (or any portion thereof subjected to liquid bath or immersion treatment) to an environment containing gas. Separation thus can be characterized as the gradual replacement of the liquid environment about the wafer 14 with a gas environment. Such a gas containing environment need not be completely gas, but it preferably is also extremely clean and contains only gases that won't adversely affect the wafer 14 surfaces or that can enhance clean separation, as will be described below in either gas or suspended liquid form.

In accordance with an aspect of the present invention, it is preferable to introduce a cleaning enhancement substance into the gas environment for enhancing the process fluid 12 flow from the wafer surfaces by the Marongoni effect. By cleaning enhancement, it is meant that the separation step is enhanced or improved by the presence of the substance, i.e. a cleaner separation results. Certain tensioactive compounds are known or may be developed for affecting the surface tension between the wafer surfaces and the processing liquid 12 at the interface of any wafer surface, the processing liquid surface and the gas environment. In particular, such tensioactive compounds desirably act at a meniscus formed at such interface that is caused as the wafer 14 and the liquid environment are relatively separated from one another. A preferred example of such a tensioactive compound that may be delivered in gas or vapor form or as a liquid (such as by atomization within a carrier gas or as applied to the processing liquid surface directly as liquid) is isopropyl alcohol ("IPA"). Other examples of suitable tensioactive compounds include ethyleneglycol, 1-propanol, 2-propanol, tetrahydrofuran, 1-butanol, diacetone alcohol, 2-ethoxyethanol, 1-methoxy-2-propanol, acetone, n-butyl acetate and hydrofluoroethers that have been more recently developed. Tensioactive compounds may be delivered in many physical forms, and by many methods, e.g., in gas form, as a gas in a carrier gas, as a liquid, as an aerosol in a carrier gas or as an aerosol introduced directly into the process vessel. The cleaning enhancement substance is preferably delivered as a gas (with or without a carrier gas). Methods for adding a cleaning enhancement substance to a carrier gas are described in commonly owned U.S. Pat. No. 5,772,784 to Mohindra et al., the entire disclosure of which is incorporated herein by reference.

Figure 4:
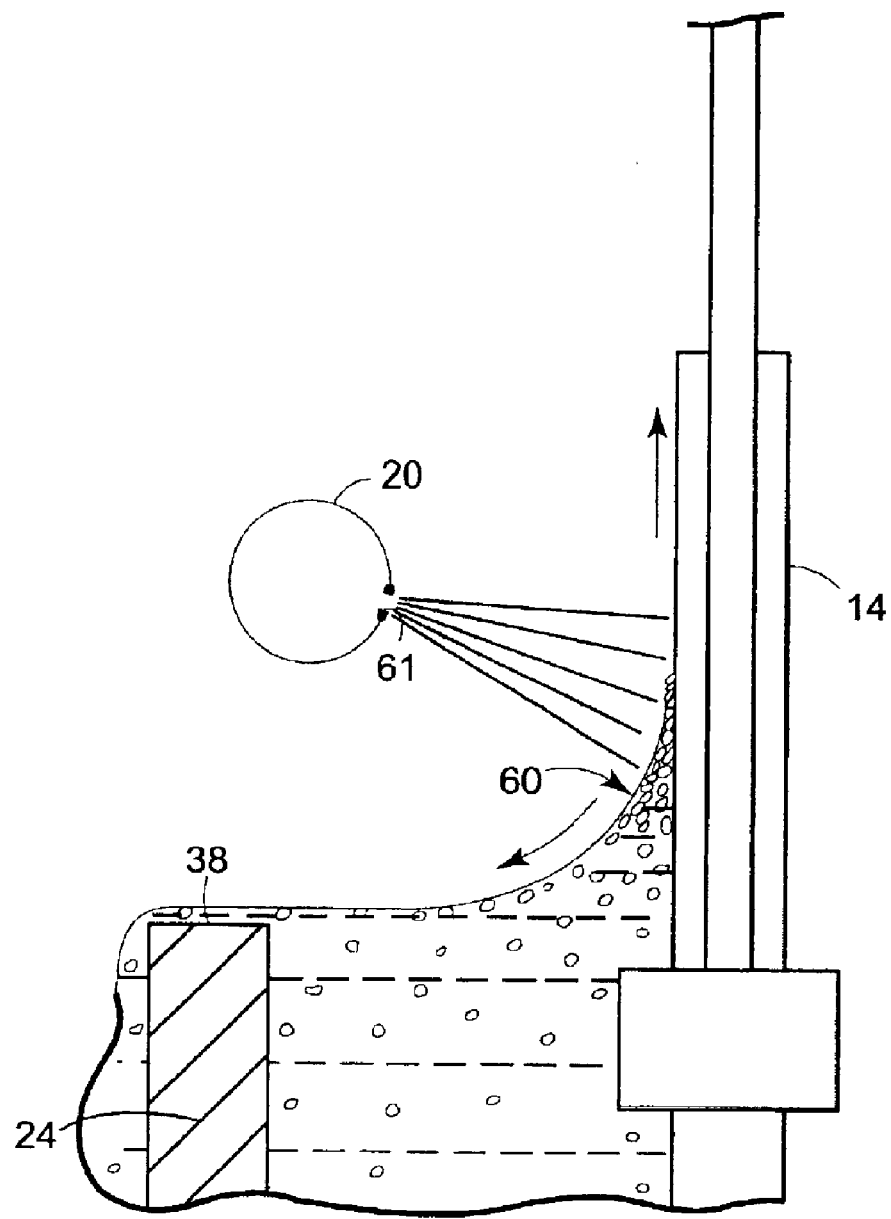
FIG. 4 is an enlarged view of a major surface of a wafer as it is lifted from a liquid bath and the creation of a meniscus between its interface and the top liquid surface and, in particular, showing the delivery of cleaning enhancement substance along the meniscus, which cleaning enhancement substance becomes dispersed within the liquid bath from the meniscus.

In accordance with an aspect of the present invention, such a cleaning enhancement substance is preferably delivered along one or more surfaces of a wafer 14 or other microelectronic device directed at and along the meniscus that is formed between the processing liquid 12, such as ultra-pure DI water, and one or both wafer major surfaces 26 and 28 during separation of the wafer 14 from the processing liquid 12. As illustrated in FIGS. 3 and 4, a meniscus 60 (exaggerated for illustration) is formed by the processing liquid's 12 attraction to the wafer surface and thus its tendency to move with the wafer surfaces in the direction of relative movement between them. Such attraction between the processing liquid 12 and the wafer surface 26, for example, is dependent upon the hydrophobic or hydrophilic nature of the wafer surface 26 among other things. A tensioactive compound is thus utilized, preferably, in order to controllably modify the surface tension of the processing liquid to the wafer surface and to cause a concentration gradient of the tensioactive compound within the processing liquid 12 that tends to cause the processing fluid to move from or accelerate off of the wafer surface. This creation of a concentration gradient of a tensioactive compound within a liquid bath at such a moving surface interface is known as the Marongoni effect. As a result, processing liquids are known to better shed from the wafer surfaces when such a concentration gradient is provided leaving them cleaner and with less likelihood of contamination by evaporation.

For delivering such a cleaning enhancement substance to the meniscus of one and preferably both major surfaces 26 and 28 of a wafer 14, nozzle(s) 20 are preferably arranged to extend along the direction of extension of the wafer major surfaces 26 and/or 28 and thus along the direction of extension of a meniscus that will be formed during relative movement of the wafer and liquid environment. More preferably, the nozzle(s) 20 are operatively supported in position near where such meniscus will be formed so that delivery of the cleaning enhancement substance can be directed at such meniscus. This position is easily estimated based upon the expected level of the processing liquid 12, which is at or just slightly above the top edges 38 of a cascade type immersion vessel 10. Where a single nozzle 20 is used, it is preferably that the nozzle also be operatively supported in position to be spaced a relatively short distance from where the wafer surface 26 or 28, for example, will pass during a separation of the wafer 14 from the processing fluid 12 bath. By these parameters, cleaning enhancement substance can be delivered directly to and along a meniscus created between a wafer surface and the processing fluid level during the separation stage. In the case of plural nozzles, a preferable arrangement is as shown in FIGS. 1–5, where a nozzle 20 is operatively supported in position as described above relative to both wafer major surfaces 26 and 28. This type of arrangement results in spaced substantially parallel nozzles 20 that are not only substantially parallel to one another, but also to each meniscus that is created along each major surface 26 and 28 during separation of the wafer 14 from the processing liquid.

Turbulence in a fluid can be characterized as local, high-speed variations in the velocity and pressure of the fluid. Turbulence in the process liquid can distort the shape of any formed meniscus, causing the meniscus to locally move rapidly over the wafer surface. A turbulent dispense of the cleaning enhancement substance containing gas with sufficient velocity can also distort the shape of an otherwise steady meniscus. The velocity of the meniscus moving across the wafer is an important parameter in optimizing the performance of clean wafer separation. Local, high-speed variations in the velocity of the meniscus are highly undesirable.

Referring to FIG. 4, turbulence at the meniscus 60 can be caused by an excessive flow of process liquid between the wafer 14 and the vessel wall 24. Turbulent flow can be predicted based upon known formulas and computer modeling of such fluid flow between the parallel surfaces and over the top wall 38. Alternatively, liquid flow rate can be optimized based initially on the visual absence of turbulence and ultimately on the cleaning performance of the system. Likewise, the geometry and placement of orifices 61 on each nozzle 20, the position of each nozzle 20 with respect to the meniscus, and flow rate of the cleaning enhancement substance may desirably be adjusted to eliminate turbulence and ultimately to achieve optimal cleaning performance.

A significant advantage over prior art delivery methods for creating a Marongoni effect at a wafer to DI water interface is that the nozzles 20 deliver the cleaning enhancement substance directly to where the effect is needed to cause the enhanced wafer/process liquid separation. Prior art methods utilized either high concentrations, large volumes or saturated levels of cleaning enhancement substance to affect the entire liquid surface. By delivering the cleaning enhancement substance, such as a tensioactive compound like IPA, directly to the meniscus, lower chemical usage is achieved even as compared with dilute chemistry solutions. Direct application also maintains the efficiency of chemical usage in partially-loaded batch systems.

Further, direct application promotes a higher concentration of cleaning enhancement substance in the meniscus region compared to other areas of the liquid's surface, creating a large surface tension gradient that allows rapid wafer/process liquid separation, permitting high-throughput operation. Direct application also allows control of the cleaning enhancement substance concentration profile along the meniscus. The non-turbulent over flow removes the cleaning enhancement substance laden surface layer of liquid and allows a controlled, consistent motion of the meniscus across the wafer. The use of a gas-phase cleaning enhancement substance allows a final distillation to occur during the evaporation of the cleaning enhancement substance, thus increasing the purity of cleaning enhancement substance delivered to the wafer.

For effective delivery of cleaning enhancement substance along one created meniscus or along each created meniscus of a plurality, it is preferable that each nozzle 20 have the ability to deliver liquid or gas from a plurality of locations along an expected line corresponding to a desired nozzle position, such as described above. Preferably thus, each nozzle 20 can be a hollow tubular nozzle with an open end for supply of cleaning enhancement substance with or without a carrier gas, a closed distal end and a series of evenly spaced delivery orifices 61. The delivery orifices 61 need not be evenly spaced, and alternatively, such a series of orifices 61 may instead comprise one or more slots. It is preferable, however, that cleaning enhancement substance (with or without carrier gas) be delivered as a gas or liquid along substantially all of a targeted meniscus that will be formed along a wafer surface (such as wafer major surface (s) 26 and 28) to leave a clean wafer surface entirely across its diametric horizontal centerline. Such a delivery distance, i.e. the dimension over which delivery orifices 61 or slots are provided along each nozzle 20, can be easily estimated by utilizing a wafer diameter as a guide.

Each nozzle 20 can be operatively supported to a side or end wall 24 or 26 of the immersion vessel 10 (or any other wall or structure of a differently designed vessel) by any conventional technique. If a nozzle 20 may be stationary, such as where the wafer 14 will be lifted by a lift mechanism 16 for separation from a processing liquid bath, the nozzle 20 may be fixed in position to a structural wall while a supply line can include or pass through the structural wall. Where a nozzle 20 is preferred to be movable, such as when the liquid bath is to be drained for creating wafer/liquid bath separation, the nozzle 20 may be mounted on any known or developed slide mechanism with a flexible supply line connected to the nozzle at a point space from the slide connection. Each nozzle 20 may also be independently supplied with cleaning enhancement substance or by way of a common manifold or the like. As shown if FIG. 5, each nozzle 20 can connect with a supply line 62, which in turn fluidically connects with a common supply manifold 64. Also as schematically shown, cleaning enhancement substance can be supplied from a source 66 into a carrier gas that is supplied from a source 68. As above, it is contemplated that the cleaning enhancement substance can instead be delivered without carrier gas.

Figure 6:
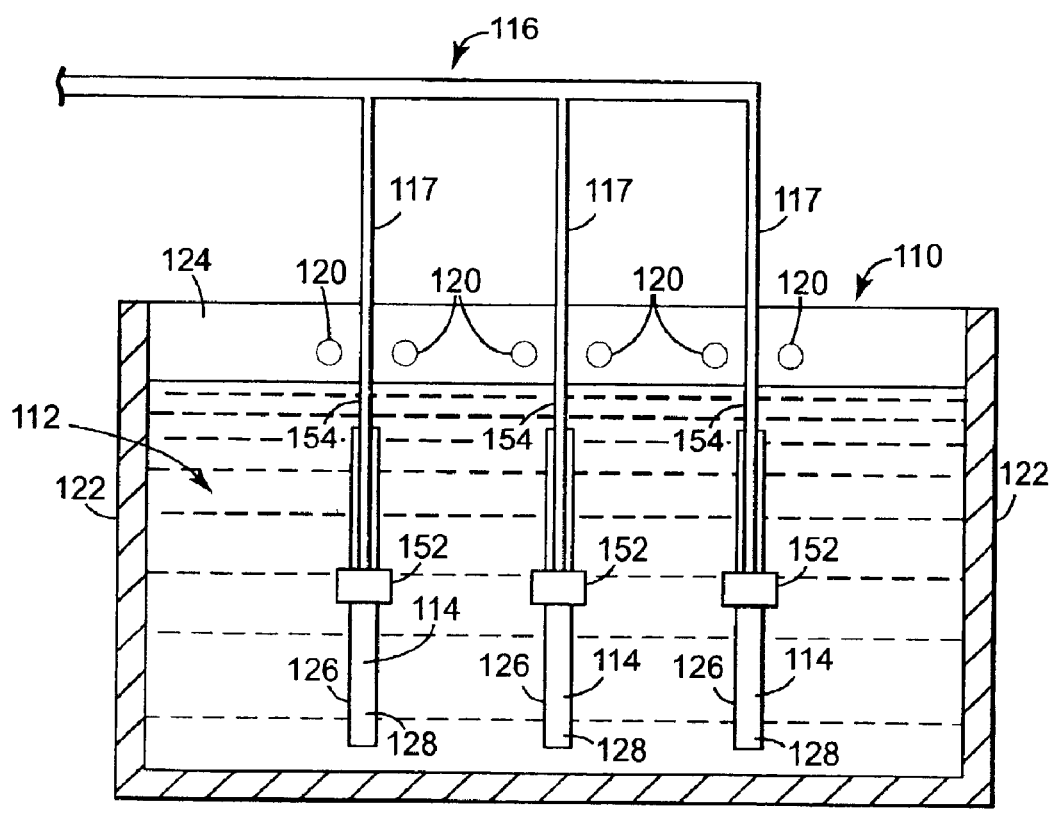
FIG. 6 is a cross-sectional side view showing a plurality of wafers supported by a lift mechanism within a multiple wafer size liquid bath vessel with the plural wafers immersed fully within the liquid bath.
Figure 7:
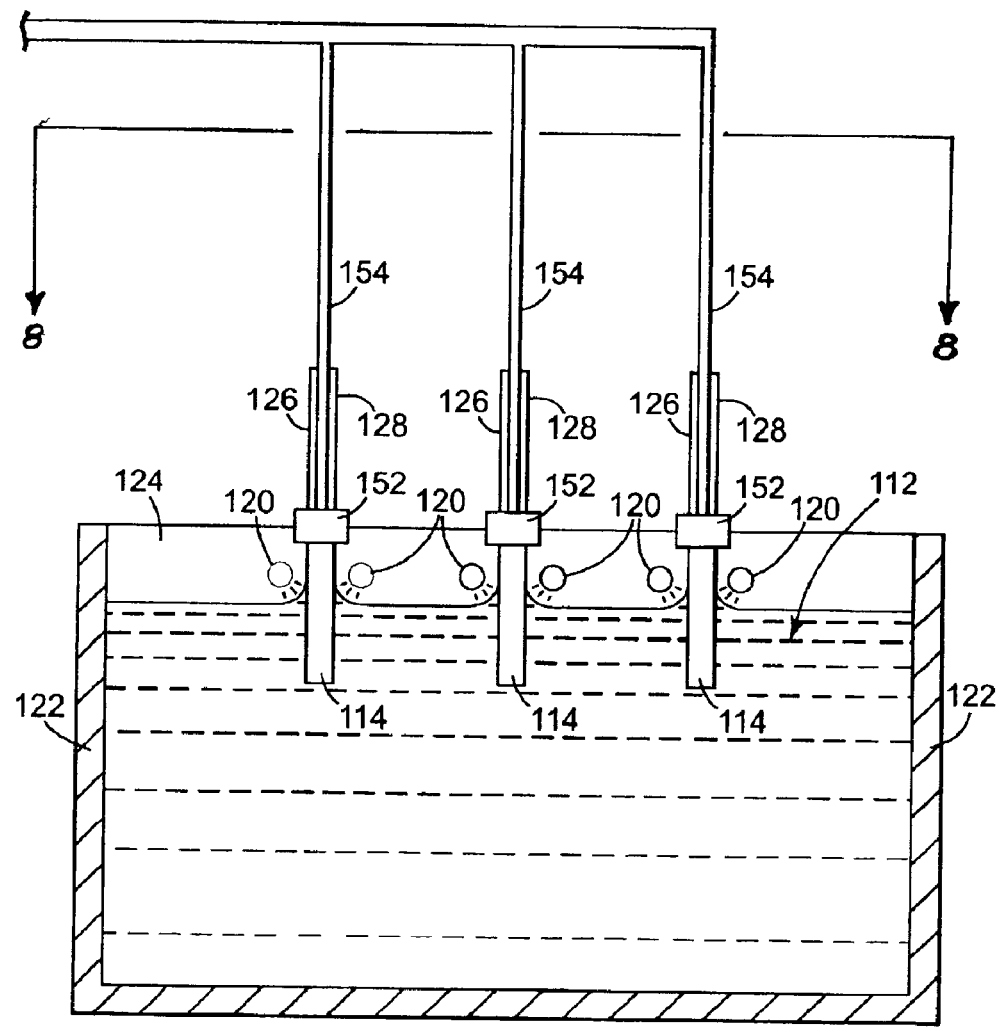
FIG. 7 is a cross-sectional side view similar to FIG. 6, but showing the plural wafers as they are lifted from the liquid bath and the creation of a meniscus on the each major side of each wafer and with cleaning enhancement substance delivery preferably along each such meniscus.
Figure 8:
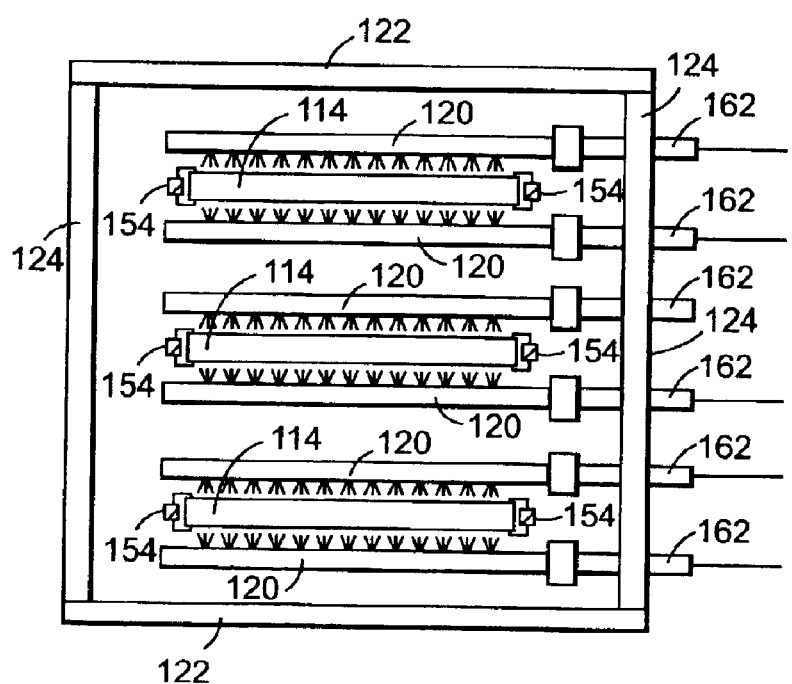
FIG. 8 is a top view taken along line 8—8 of FIG. 7 illustrating the delivery of cleaning enhancement substance preferably substantially along the wafer major surfaces of each wafer along the meniscus formed on both wafer sides.
Figure 9:
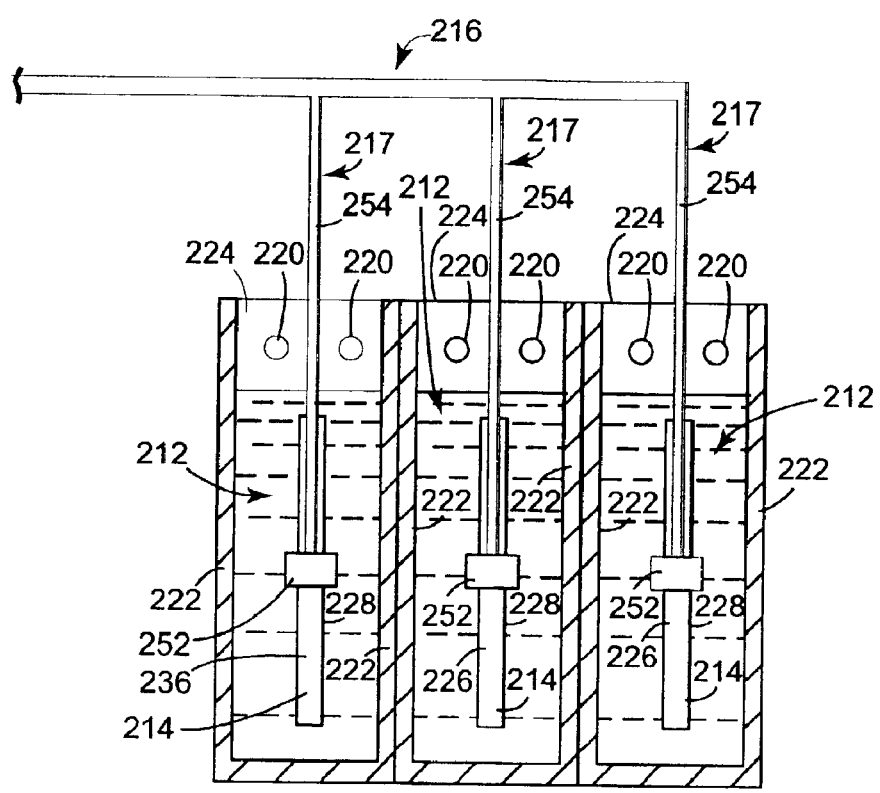
FIG. 9 is a cross-sectional side view showing a plurality of wafers supported by a lift mechanism within a like plurality of individual single wafer size liquid bath vessels with the plural wafers immersed fully within the liquid baths.
Figure 10:
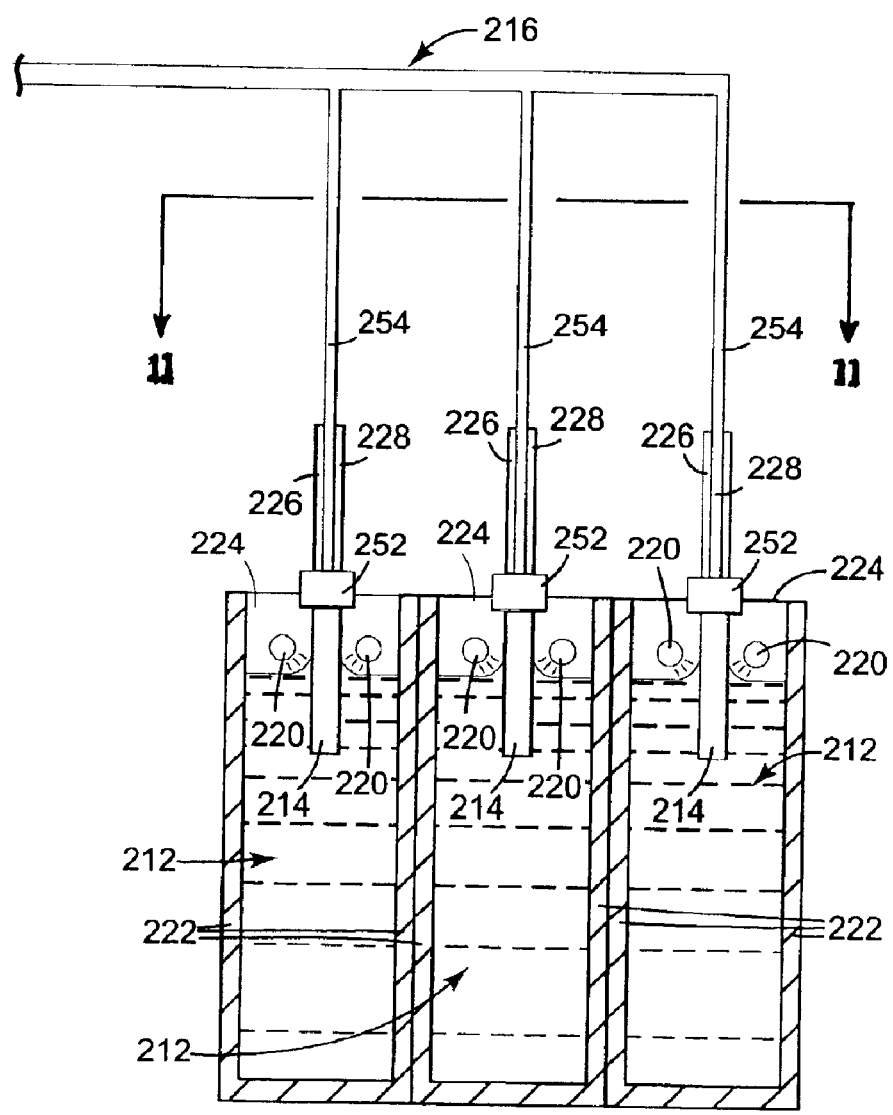
FIG. 10 is a cross-sectional side view similar to FIG. 9, but showing the plural wafers as they are lifted from the individual liquid baths and the creation of a meniscus on each major side of each wafer and with cleaning enhancement substance delivery preferably along each such meniscus.
Figure 11:
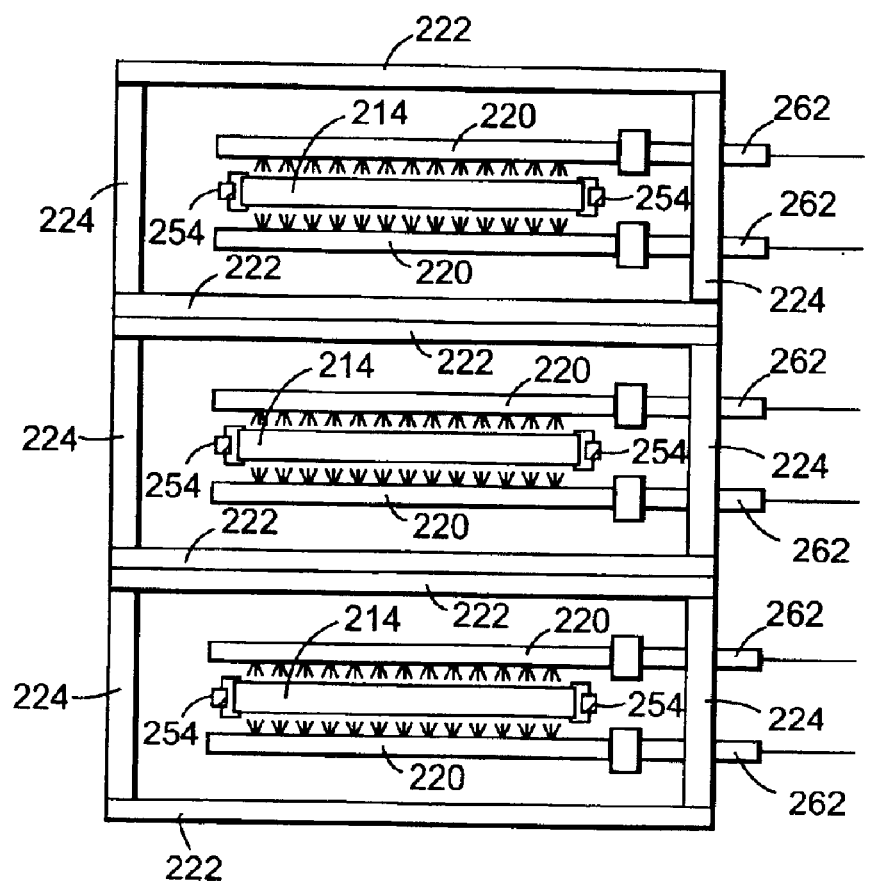
FIG. 11 is a top view taken along line 11—11 of FIG. 10 illustrating the delivery of cleaning enhancement substance reference we substantially along the wafer major surfaces of each wafer with respect to each vessel along the meniscus formed on both wafer sides.

With reference to FIGS. 6, 7 and 8, a multiple wafer size immersion vessel 110 is illustrated with a plurality of wafers 114 supported by a multiple wafer lift mechanism 116 and with the wafers 114 completely immersed within a processing liquid 112 bath. Above the liquid surface 118, a pair of nozzles 120 are preferably provided for each wafer 114 that the immersion vessel 110 is designed to process. Likewise, the lift mechanism 116 preferably includes a like number of wafer support devices 117.

Immersion vessel 110, is illustrated, is generally rectangularly shaped, as viewed from above (see FIG. 8), like immersion vessel 10, described above, except that immersion vessel 110 is of greater length to accommodate the processing of a plurality of wafers 114, which accommodation includes the provision of the multiple pairs of nozzles 120. Specifically, the illustrated immersion vessel 110 comprises a pair of spaced end walls 122 and a pair of spaced sidewalls 124. As above with the previous structure of vessel 10, the end walls 122 and sidewalls 124 a comprise any material suitable for a particular processing liquid 112, and they may be formed of any number of separate components or as components integral with one another. The end walls 122 are likewise preferably dimensioned to accommodate the height of processing liquid 112 that is utilized to cover wafers 114 that may be suspended or otherwise supported within immersion vessel 110 and to accommodate the plurality of wafers 114 and flow requirements between and around the major surface is 126 and 128 of each wafer 114. Sidewalls 124 are preferably dimensioned to accommodate the height of processing liquid 112 that is utilized to cover the wafers 114 and to accommodate wafer diameter and fluid flow requirements around the wafer in the same sense as that described above with respect to the vessel 10. Again, other shaped vessels are contemplated for facilitating processing of multiple wafers 114 or other microelectronic devices that may comprise different shapes as well.

In FIGS. 6, 7 and 8, the immersion vessel 110 is not illustrated as a cascade rinser, as described above with respect to vessel 10, in that an outer vessel is not shown. However, it is contemplated that such an arrangement may be provided in any of the ways described above or otherwise developed to accommodate cascade type fluid flow. Alternatively, immersion vessel 110 like immersion vessel 10, described above, may provide a liquid bath without utilizing a cascading type flow.

As above, immersion vessel 110 is preferably sized to accommodate any number of a plurality of wafers 114 so that at least a portion of each wafer 114, or other microelectronic device, can be immersed within the processing liquid 112. For more wafers 114, the length of end walls 122 can be increased to accommodate space for any additional number of wafers 114, pairs of nozzles 120, and the ability to support the wafers 114 within the processing liquid 112, such as by lift mechanism devices 117. Although for each wafer 114, a pair of nozzles 120 is illustrated, it is contemplated that only one such nozzle 120 may be provided for each wafer 114 for cleaning enhancement of only a single wafer major surface 126 or 128 of the wafer 114. Moreover, between any two wafers 114, a single nozzle 120 can include delivery orifices along two lines and extension for delivering cleaning enhancement substance to each meniscus that will be created as the wafers 114 are separated from the processing fluid 112. FIGS. 7 and 8 illustrate the preferable delivery of cleaning enhancement substance substantially entirely along each meniscus 160 formed along wafer major surfaces 126 and 128 during the separation step. Moreover, as illustrated in FIG. 8, spaced delivery orifices 161 preferably evenly deliver cleaning enhancement substance along each meniscus 160.

The lift mechanism 116 is illustrated schematically as comprising gripping devices 117, each of which may comprise suspension elements 154 and gripping pads 152 in the same manner as that discussed above with respect to the first embodiment. Also as above, any number of variations are contemplated for supporting wafers 114 and for raising and lowering the wafers 114 as well as for causing the separation of processing fluid 112 and the individual wafers 114. All other aspects of control and construction as described above with respect to vessel 10 are also contemplated with respect to immersion vessel 110. The principles of operation are similar to that described above with respect to the embodiment of FIGS. 1 through 5, except that a plurality of wafers 114 are processed similarly in that the same time within a single immersion vessel 110.

In any case, as with the above embodiments, it is preferable that nozzles 120 extend sufficiently within the immersion vessel 110 to provide cleaning enhancement substance substantially entirely over at least one of the first or second major surfaces 126 and 128 for enhancing cleaning thereof and manner described above. Also as above, the delivery of any cleaning enhancement substance and use of any processing fluid 112 are contemplated in the same manner as that described above.

Figure 12:
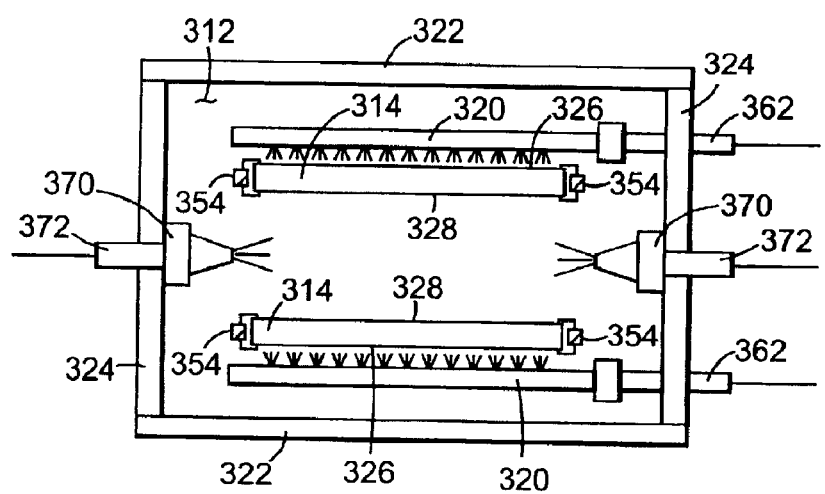
FIG. 12 is a top view illustrating the delivery of cleaning enhancement substance preferably substantially along the device side of wafers along the meniscus formed thereon and generally to the wafer backsides.

A similar embodiment is also contemplated wherein plural wafers may be processed together in a single bath by a delivery system that utilizes a separate delivery nozzle for dispensing a cleaning enhancement substance along the meniscus of a single major surface of each wafer. In the case of silicon semiconductor wafer as illustrated in FIG. 12, delivery nozzles 320 could be used to treat the major surface of the wafers 314 on which electronic devices are formed or are to be formed (the "device" side 326). The major surface oppositely facing than the device side is known as the "backside" 328 of the wafer. The two wafers could be oriented with their backsides 328 facing toward each other, and their device sides 326 oriented facing outward toward the inner surfaces of sidewalls 322 of the vessel 310. This arrangement allows the maximum space for placement of the cleaning enhancement substance delivery nozzles for treating the device sides of the wafers. That is, the backsides 328 can be more closely spaced from one another than the device sides 328 because there is no need to accommodate any nozzle 320 between them (such distance between backsides 328 being exaggerated for illustration in FIG. 12).

In this aspect, the backsides of the wafers and their menisci are not directly treated with the cleaning enhancement substance along the entire length of their menisci. Rather, cleaning enhancement substance may also be dispensed from the perimeter of the wafers, either for example, from above the wafers (not shown), such as from a lid, or from the sides of the wafers, as described respectively in U.S. Pat. No. 5,772,784 to Mohindra et al. and U.S. Pat. No. 6,139,645 to Leenaars et al. As shown in FIG. 12, dispensing nozzles 370 can be arranged, for example, above end walls 324 for directing additional cleaning enhancement substance toward the processing liquid 312. Dispensing nozzles 370 can be connected with supply lines 372 similar to lines 362 of nozzles 320. This would provide a more general application of cleaning enhancement substance to the processing liquid 312 for enhanced cleaning of wafer backsides 328, but without the specific advantages associated with the use of nozzles 320 as detailed above. This aspect has the advantage of processing two or more wafers in a single bath without the mechanical complexity of locating a delivery nozzle between wafer pairs. As the backside 328 of the wafers typically have little spatial variation in surface composition, and little topography, they have less stringent cleaning separation requirements than the device side 326.

A somewhat different embodiment is illustrated in FIGS. 9 through 12 for processing multiple wafers 214 at the same time. Unlike the just previously described embodiments, multiple wafers 214 may be processed at the same time but within single wafer size immersion vessels 210. As such, each immersion vessel 210 can contain processing liquid 212 that a quantity desired to provide a liquid bath within which at least a portion of each wafer 214, or other microelectronic device, can be processed within the processing liquid 212.

A significant advantage of such a system is that any number of individual immersion vessels 210 can be arranged adjacent to one another to make a series or an array of immersion vessels 210 that can be utilized for wafer processing. That is, any number of immersion vessels 210 can be arranged end wall 222 to end wall 222 and/or sidewall 224 to sidewall 224 to create such a series or array of immersion vessels 210. Even where an array of a certain size is set up, the processing of any number of wafers up to the maximum number of immersion vessels 210 can be facilitated by simply only loading a wafer 214 or other microelectronic device within lift support devices 217 as needed. The non used immersion vessels 210 would thus not need to be filled or otherwise provided with any processing fluids or cleaning enhancement substance. Thus, it is preferable that with respect to any and all of the embodiments suggested in this application, appropriate control valves may be utilized in each chemical or processing fluid supply line, as are conventionally known, so that all processing fluid flow and dispensing can be controlled. Moreover, it is contemplated that manual or automatic control systems may be incorporated as desired to control such operation.

Other construction and operational aspects discussed above with respect to the embodiment of FIGS. 1 through 5 and the embodiment of FIGS. 6 through 8 are also contemplated to be used in accordance with this embodiment. That is, other shaped immersion vessels 210 may be constructed based upon specific applications and the type of microelectronic device to be processed, and cleaning enhancement substance may be provided to one or more surfaces thereof, such as first and second major surfaces 226 and to 228 of wafers 214. The lift mechanism 216 may comprise any of the mechanisms describers just above with the understanding that the wafers 214 may be independently separated from the processing fluids 212, and to do that, individual elevators may be utilized.

In any case, as with the above embodiments, it is preferable that nozzles 220 extend sufficiently within the immersion vessels 210 to provide cleaning enhancement substance substantially entirely over at least one of the first or second major surfaces 226 and 228 for enhancing cleaning thereof and manner described above. Also as above, the delivery of any cleaning enhancement substance and use of any processing fluid 212 are contemplated in the same manner as that described above.

EXAMPLES

Wafer cleaning experiments were conducted on 200 mm diameter, 0.75 mm thick silicon wafers in a single-wafer vessel similar to that shown in FIGS. 1 through 5. The wafer was vertically oriented and centered horizontally in a rectangular, 265 mm wide by 8 mm deep by 265 mm high vessel cavity. The process cavity was formed by machining two 1" polyvinylidine fluoride (PVDF) sheets and welding them together at the sides and bottom. Liquid entered the cavity through holes in the side walls near the bottom of the vessel.

The outer vessels spanned the full width of the side walls, were constructed of ⅛" PVDF, and formed a 49 mm wide by 70 mm high channel to catch the overflow from the inner vessel. The weir consisted of 18 mm thick PVDF plate angled at 45°. There was a series of 3 mm deep v-grooves with a 60° included angle cut at a 4.75 mm pitch across the full width of each weir.

Semiconductor grade, ultrapure deionized water (DI water) was used as the process liquid and semiconductor grade isopropyl alcohol (IPA) was used as the cleaning enhancement substance. A 97:3 blend of $N_2$:IPA was created by evaporating IPA into $N_2$ by a bubbler system and that blend was dispensed toward the wafer/DI water menisci through two, 4.76 mm (inside diameter)×9.53 mm (outside diameter) PVDF tubes with 80, 0.635 mm diameter holes at a 3.18 mm spacing. Process performance was determined first by the wafer surface being visibly clean and dry as it emerged from the water and second by the number of added light-scattering defects (particles) larger than 0.12 microns as determined by a KLA-Tencor SP-1 TBI surface inspection system.

The suspension elements and gripping pads were fashioned from a single ⅛" PVDF sheet with a 210 mm diameter hole in which to mount the wafer. Thin tabs of PVDF protruded into the hole to hold the wafer in place. The drive mechanism consisted of a linear actuator capable of raising the wafer vertically out from the liquid in the vessel at speeds from 1 mm/sec.

Initial testing to determine the effects of flow rates were performed with the $N_2$:IPA directed approximately 8 mm above the menisci with an orifice to wafer spacing of approximately 3.5 mm. The weir structure was as above and otherwise unobstructed. Results are shown below in Table 1, where the flow rate of $N_2$:IPA is determined to be the dominant variable in determining the minimum wafer clean/water separation (substantially dry major wafer surfaces) time. Water flow rate was less important, with low water flow rates being preferable. However, some water flow rate was considered important in that tests also conducted at zero water flow required 200 seconds to separate cleanly from the water with a 5 lpm flow of $N_2$:IPA and could not be acceptably dried with lower $N_2$:IPA flows.

TABLE 1

Minimum dry time with an unobstructed weir as a function of water and $N_2$:IPA flow rate.

| $N_2$:IPA flow (l/min) | Water Flow (l/min) | Minimum Dry Time (sec) |
|---|---|---|
| 1 | 1 | 100 |
| 1 | 3 | 100 |
| 1 | 6 | 100 |
| 3 | 1 | 20 |
| 3 | 3 | 15 |
| 3 | 6 | 20 |
| 5 | 1 | 15 |
| 5 | 3 | 15 |
| 5 | 6 | 15 |

Table 3 shows a comparison of direct application of the $N_2$:IPA mixture to the menisci of a wafer rising from an overflowing vessel to a process where the water is drained from a closed vessel and the created head space is flooded with $N_2$:IPA (as described in U.S. Pat. No. 5,772,784 to Mohindra et al.). In this case, the nozzles used for direct application of the $N_2$:IPA were oriented such that the streams of gas were directed at the menisci with an orifice-to-menisci distance of approximately 6 mm. The direct application system had a water overflow rate of approximately 1 lpm while the batch immersion system vessel was drained at a rate of approximately 15 lpm.

TABLE 2

N₂:IPA usage with the gas directed at the menisci.

| Tool | Wafers Processed per Batch | N₂:IPA Flow Rate (lpm) | Dry Time (sec) | N₂:IPA Used per Batch (liters) | N₂:IPA Used Per Wafer (liters) |
|---|---|---|---|---|---|
| Batch Immersion | 50 | 150 | 160 | 400 | 8 |
| Direct Application | 1 | 0.8 | 20. | 0.27 | 0.27 |

The direct application process required approximately $\frac{1}{8}^{th}$ the time and $\frac{1}{30}$ the volume of N₂:IPA.

We claim:

1. A method of rinsing a microelectronic device comprising:
   immersing at least a portion of a surface of the microelectronic device within an immersion vessel containing a liquid bath;
   separating the microelectronic device from the liquid bath into a gas environment and, during such separation, forming a meniscus at an interface between the surface of the microelectronic device and the liquid bath; and
   delivering a cleaning enhancement substance into the gas environment and specifically directed to the meniscus that is formed while the microelectronic device is separated from the liquid bath, the delivery of cleaning enhancement substance being conducted as a series of gas streams formed by a nozzle with a series of delivery orifices arranged along the direction of extension of the meniscus along the surface of the microelectronic device so that a gradient in the surface tension of the liquid at the meniscus is created.

2. The method of claim 1, wherein the delivery step further comprises delivering cleaning enhancement substance to menisci that are formed at a plurality of surfaces of the microelectronic device.

3. The method of claim 1, wherein portions of a plurality of microelectronic devices are immersed within a liquid bath at the same time and at least one surface of each microelectronic device is separated from the liquid bath so that a meniscus is formed at that surface and wherein the delivery step further comprises delivering cleaning enhancement substance to a meniscus formed at that surface.

4. The method of claim 3, wherein the plurality of microelectronic devices are immersed together within an immersion vessel.

5. The method of claim 4, wherein the cleaning enhancement substance is delivered to menisci that are formed at plural surfaces of a plurality of microelectronic devices.

6. The method of claim 3, wherein the plurality of microelectronic devices are immersed at the same time, but within liquid baths provided within separate immersion vessels.

7. The method of claim 6, wherein the cleaning enhancement substance is delivered to menisci that are formed at plural surfaces of a plurality of microelectronic devices.

8. The method of claim 3, wherein the cleaning enhancement substance is delivered as a series of gas streams arranged along the direction of extension of the menisci formed at oppositely facing surfaces of a plurality of the microelectronic devices while cleaning enhancement substance is also delivered to the gas environment.

9. A method of rinsing microelectronic devices comprising: immersing a plurality of microelectronic devices within an immersion vessel containing a liquid bath; separating the microelectronic devices from the liquid bath into a gas environment and, during such separation, forming menisci at interfaces between the surfaces of the microelectronic devices and the liquid bath; and delivering cleaning enhancement substance into the gas environment and specifically directed to menisci formed at surfaces of a plurality of microelectronic devices, wherein the cleaning enhancement substance is delivered to menisci by supplying gas flow from nozzles arranged in the direction of extension of the menisci formed at opposite surfaces of a plurality of the microelectronic devices while the cleaning enhancement substance is also delivered by another dispensing nozzle to the gas environment.

10. The method of claim 9, wherein the cleaning enhancement substance is delivered by an elongate nozzle having a series of delivery orifices.

11. The method of claim 9, wherein the plurality of microelectronic devices are immersed together within an immersion vessel.

12. The method of claim 11, wherein the cleaning enhancement substance is delivered to menisci that are formed at plural surfaces of a plurality of microelectronic devices.

13. The method of claim 9, wherein the plurality of microelectronic devices are immersed at the same time, but within liquid baths provided within separate immersion vessels.

14. The method of claim 13, wherein the cleaning enhancement substance is delivered to menisci that are formed at plural surfaces of a plurality of microelectronic devices.

* * * * *